United States Patent [19]

Ogata et al.

[11] Patent Number: 4,556,619
[45] Date of Patent: Dec. 3, 1985

[54] NEGATIVE-TYPE ACETALIZED POLYVINYL ALCOHOL RESIST SENSITIVE TO IONIZING RADIATION

[75] Inventors: Naoya Ogata, Kamakura; Kohei Sanui; Chiaki Azuma, both of Tokyo; Hozumi Tanaka, Funabashi; Kiyoshi Oguchi, Sayama; Yoichi Takahashi, Urawa; Tomihiro Nakada, Kodaira, all of Japan

[73] Assignee: Dai Nippon Insatsu Kabushiki Kaisha, Japan

[21] Appl. No.: 432,865

[22] Filed: Oct. 5, 1982

[30] Foreign Application Priority Data

Sep. 3, 1982 [JP] Japan ................ 57-152645

[51] Int. Cl.$^4$ ................ G03C 1/71
[52] U.S. Cl. ................ 430/17; 430/270; 430/296; 430/907; 430/909; 204/159.14
[58] Field of Search ............ 430/270, 296, 286, 907, 430/909, 17; 204/159.14, 159.21, 159.22; 525/61; 526/208

[56] References Cited

U.S. PATENT DOCUMENTS 2,929,710  3/1960  Martin ................ 204/159.14
2,980,535  4/1961  Schroeter ................ 430/270
4,478,977  10/1984  Sperry et al. ................ 430/270

FOREIGN PATENT DOCUMENTS 589896  1/1978  Japan .

*Primary Examiner*—Richard L. Schilling
*Attorney, Agent, or Firm*—Stevens, Davis, Miller & Mosher

[57] ABSTRACT

An acetalized polyvinyl alcohol having a molecular weight of 10,000 to 1,000,000 represented by the formula:

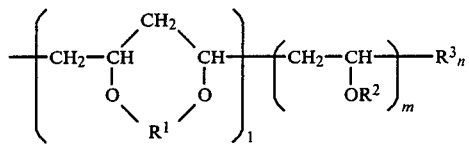

wherein: $R^1$ represents a halogen-containing residue of an aldehyde or a ketone; $R^2$ represents a hydrogen atom, which may partially be substituted with an acetyl group; $R^3$ represents naught or a monomeric unit co-polymerizable with vinyl acetate; and l, m, n are integers indicating polymerization degrees, has excellent characteristics such as high sensitivity, high resolving power and excellent dry etching resistance and is suitable as a negative-type resist in ionizing radiation lithography.

4 Claims, No Drawings

NEGATIVE-TYPE ACETALIZED POLYVINYL ALCOHOL RESIST SENSITIVE TO IONIZING RADIATION

TECHNICAL FIELD

This invention relates to a resist material suitable for fine pattern formation to be used in the lithographic process during manufacture of a high-density integrated circuit such as LSI or ultra LSI, etc., or a photomask useful for production thereof. More particularly, it pertains to a novel negative-type resist material which has a high sensitivity and a high resolving power with respect to ionizing radiation and can produce a resist film of excellent etching resistance after hardening.

BACKGROUND ART

As is well known in the art, the demand for higher performance as well as higher degree of integration of semiconductor integrated circuits is ever increasing in recent years. For this reason, as a lithographic technique, in place of the photolithography employing ultra-violet rays of the prior art, efforts have been made to establish an ultra-fine pattern working technique by the use of ionizing radiation of higher energy with shorter wavelength, namely, an electron beam, soft X-rays, an ion beam, etc.

On the other hand, for enabling an ultra-fine lithography by such a change of radiation source, the resist material to be used must have corresponding characteristics. Generally speaking, the resist material to be used in ultra-fine lithography with the use of a high energy ionizing radiation is required to have the following characteristics:

(a) High sensitivity to the ionizing radiation;
(b) High resolving power;
(c) Capability of forming a uniform thin film;
(d) Excellent resistance to dry etching so that dry etching which is essential for high density micropatternization may be applicable; and
(e) Excellent developing characteristics.

In the prior art, a great number of resists sensitive to ionizing radiations have been developed to be used for the above purpose. These resists may be classified into the positive-type in which the irradiated portion disintegrates to be solubilized by irradiation of an ionizing radiation and the negative type in which the irradiated portion undergoes crosslinking to be insolubilized by irradiation of an ionizing radiation.

Of these, the positive-type resists entail difficulty in selection of developers because generally a narrow scope of developers has characteristics adapted therefor and also suffer from the drawback of weak resistance to dry etching. In contrast, most of the negative-type resists are superior in these respects to the positive-type ones.

Representative of the negative-type resists developed in the prior art are the polyglycidyl methacrylate type, glycidyl methacrylate-ethyl acrylate copolymer type, and unsaturated carboxylic acid-methacrylate copolymer type. However, these negative-type resists have some drawbacks in practical application and cannot be said to be satisfactory. For example, a glycidyl methacrylate type resist, while having high sensitivity, has a low resolution, practically as low as only about 2.0 μm, due to generation of a large amount of scum at the brim portions of the drawn image pattern. Moreover, each of the above resists has low dry etching resistance (with too much or too fast reduction in film thickness during dry etching) and therefore has a disadvantage in that it is difficult to apply thereto a dry etching process, which is indispensable for high-density micropatternization.

In view of the state of the art as described above, one of the present inventors has already developed a novel negative-type resist sensitive to ionizing radiation which has high sensitivity and excellent dry etching resistance and is also capable of attaining a high degree of resolution. The negative-type resist sensitive to ionizing radiation comprises an acetalized polyvinyl alcohol polymer having a molecular weight of 10,000 to 1,000,000 represented by the formula:

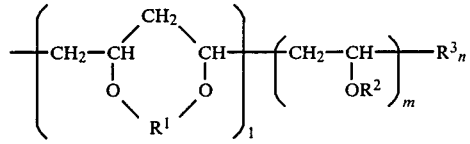

wherein $R^1$ represents a residue of an aldehyde or a ketone; $R^2$ a hydrogen atom, which may be partially substituted by an acetyl group; $R^3$ naught or a monomeric unit copolymerizable with vinyl acetate; l, m, n integers indicating polymerization degrees.

SUMMARY OF THE INVENTION

A principal object of the invention is to provide a negative type resist sensitive to ionizing radiation having a further improved sensitivity. We have found that, among the above mentioned class of the acetalized polyvinyl alcohol polymers, a group of polymers having a halogen atom in the $R^1$ group has an especially high sensitivity to ionizing radiation.

Based on the above finding, the present invention, according to a principal aspect thereof, provides a negative-type resist sensitive to ionizing radiation which comprises an acetalized polyvinyl alcohol polymer having a molecular weight of 10,000 to 1,000,000 represented by the formula:

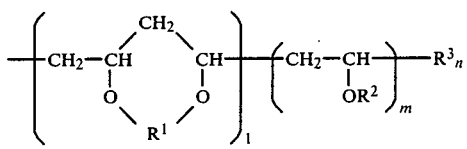

wherein $R^1$ represents a halogen-containing residue of an aldehyde or a ketone; $R^2$ a hydrogen atom, which may be partially substituted by an acetyl group; $R^3$ being absent or if present, being a monomeric unit copolymerizable with vinyl acetate; l, m, n integers indicating polymerization degrees.

The acetalized polyvinyl alcohol polymer constituting the resist of the present invention is known as to its structure or preparation method per se, for example, as a modified vinylon or its preparation method. However, utilization as a crosslinked resin thereof, especially for providing a resist film of excellent dry etching resistance by crosslinking by irradiation of an ionizing radiation is not known.

The present invention, according to another aspect thereof, provides an ionizing radiation lithography in which the above mentioned resist of the invention is used.

The nature, utility, and further features of this invention will be more clearly apparent from the following detailed description beginning with a consideration of general aspects of the invention and concluding with specific examples of practice thereof.

The terms "%" and "part" used hereinafter in connection with compositions are by weight unless otherwise specified.

The group $R^1$ included in the acetalized moiety in the acetalized polyvinyl alcohol polymer represented by the above formula is a halogen-containing residue derived from a halogen-containing aldehyde or ketone during acetalization occurring between the aldehyde or ketone and an alcohol. Thus, the term "acetalization" mentioned in the present specification is intended to be inclusive also of dehydrating condensation between a ketone and an alcohol (so called ketal formation) in addition to the acetalization in the narrow sense of dehydrating condensation between an aldehyde and an alcohol.

As an example of such halogen-containing groups, there is the following group derived from a halogenated cyclohexanone:

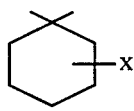

wherein X is a halogen. In addition, when the halogen-containing groups $R^1$ derived from an aldehyde are represented comprehensively by the formula:

$R^0$ may include the following:
as the aliphatic type:
—$CX_3$, —$CH_2X$, —$(CH_2)_4X$, etc.
as the aromatic type:

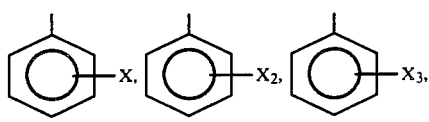

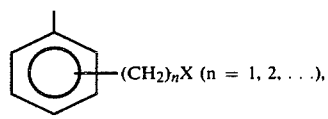

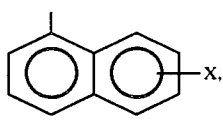

as the heterocyclic type:

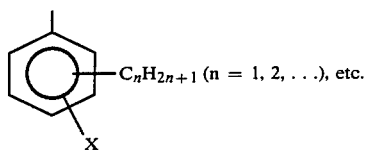

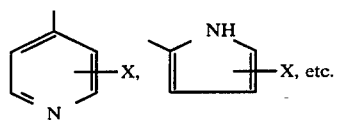

Among the above enumerated $R^0$ groups, those of the aromatic type are especially preferred from the viewpoints of high sensitivity and excellent dry etching resistance.

The halogen species may be any of F, Cl, Br, I, but is preferably Cl because of high sensitivity, and a mono-halogen-containing group is preferred. In particular, a group obtained by nucleus-substitution of a single halogen for a hydrogen in a mono-benzene ring is preferred. As the position of the mono-halogen substituent, metha- or para-position is preferred.

Preparation of the above acetalized polyvinyl alcohol polymer can be carried out according to a known reaction. Thus, as briefly referred to in the description of the above group $R^1$, it can be obtained by acetalization of polyvinyl alcohol with an aldehyde or a ketone in a homogeneous system or an inhomogeneous system, in the presence of, for example, an acid such as hydrochloric acid or sulfuric acid or a salt thereof. Alternatively, the acetalized polyvinyl alcohol polymer can also be obtained from polyvinyl acetate or a partially saponified product thereof as the starting material, by allowing deacetylation and acetalization to proceed simultaneously in a similar system. Further, it is also possible to carry out acetalization between an aldehyde or a ketone and a copolymer of vinyl acetate with a monomer copolymerizable with vinyl acetate such as ethylene or styrene in place of polyvinyl alcohol or polyvinyl acetate.

Thus, there can be obtained an acetalized polyvinyl alcohol polymer as represented by the above formula.

As can be understood from the above description, groups represented by $R^2$ are ordinarily H (hydrogens), but a part of them may be an acetyl group ($CH_3CO$) derived from polyvinyl acetate. The group $R^3$ represents naught or polymeric units of ethylene, styrene, etc. Also, as is apparent from the preparation steps, the acetalized polyvinyl alcohol polymer is generally a random copolymer, and the expression by the above formula does not necessarily mean the bonding mode of a block copolymer.

The acetalized polyvinyl alcohol polymer as a whole has a molecular weight in the range of from 10,000 to 1,000,000. In general, the sensitivity becomes higher as the molecular weight increases, but the coating characteristics are impaired at an excessively high molecular weight. For affording suitable characteristics as an ionization radiation resist such as desirable sensitivity and etching resistance, the mole content of the acetalized moiety, namely $1/(l+m+n)$ is preferably 20 to 85%, particularly 20 to 80%. When the vinyl alcohol polymer units are represented by $m_1$ and the vinyl acetate polymer units by $m_2(m_1+m_2=m)$, the vinyl alcohol polymer units content, namely $m_1/(l+m+n)$ is preferably 10 to 70 mole %, the vinyl acetate polymer units content, namely, $m_2/(l+m+n)$, being 40 mole % or less, the other polymeric units content, namely, $n/(l+m+n)$, being 20 mole % or less.

The resist of the present invention is preferably constituted by the above acetalized polyvinyl alcohol polymer alone, but it may also be constituted, if desired, by a mixture of the polymer with other polymers highly compatible with the polymer and having good solubility in solvents. Examples of such polymers include polyvinyl acetate, polyvinyl alcohol (inclusive of partially saponified polyvinyl acetate), ethylene/vinyl acetate copolymer and partially saponified products thereof, and styrene/vinyl acetate copolymer and partially saponified products thereof. When used as a mixture, the acetalized polyvinyl alcohol polymer represented by the above formula is used preferably in a proportion of 50% by weight or more based on the total weight with the other polymers.

Now, the lithographic process with the use of the resist of the present invention will be described below.

First, the resist of the present invention is dissolved in one or a mixture of solvents selected from aromatic solvents such as benzene, xylene, and chlorobenzene; ketone type solvents such as acetone and methyl ethyl ketone; chlorine-containing solvents such as chloroform and ethylene chloride; and cellosolve type solvents such as methyl cellosolve, ethyl cellosolve, and ethyl cellosolve acetate, to prepare about 5 to 15% solution having a viscosity suitable for coating.

The resist solution is applied uniformly in a conventional manner by spinner coating, etc. on a semiconductor substrate or a mask substrate (blank) to be treated. Examples of appropriate semiconductor substrates include silicon substrates optionally covered with a thin layer of silicon dioxide, silicon nitride polysilicon or aluminum. Examples of appropriate mask substrates (blanks) include a single-layer chromium (Cr) mask blank, two- or three-layer chromium maskblank with one or both surfaces of low reflection, see-through type mask blank comprising (i) a compound of silicon and silicon oxide or (ii) ferric oxide, single layer tantalum (Ta) mask blank, and two- or three-layer tantalum mask blank with low surface reflection and conductive mask blanks comprising an additional transparent electroconductive layer along with the above mentioned masking layers (such as Cr, Ta and silicon compound layers).

The thus coated substrate is then subjected to a pre-bake treatment, to form a resist film of a thickness of about 0.1-2 μm. The pre-bake conditions differ depending on the solvent employed. In general, a temperature of 70°-90° C. and a time of 20 to 40 minutes are suitable in case of lower alcohols.

Subsequently, at the desired portions of the resist film, an ionizing radiation such as an electron beam or soft X-ray is applied to accomplish pattern drawing, followed further by treatment with a developer to dissolve away selectively the unirradiated portions, thereby forming a resist pattern. As the developer, solvents similar to those used for preparation of resist solutions as described above are preferably employed. The thus formed resist pattern is preferably rinsed, for example, with a lower alcohol.

The substrate having the resist pattern after development may be subjected to post-bake treatment and scum elimination treatment, as necessary, and thereafter subjected to etching to form an etching pattern at the exposed portion of the substrate. The post-bake treatment may be conducted, for example, at a temperature of 120°-140° C. for 20-40 minutes. On the other hand, the scum elimination treatment can be conducted, for example, with the use of an oxygen plasma under the conditions of a pressure of 0.9-1 Torr and an output of 100 W for 1-2 minutes.

For etching, either wet etching or dry etching may be applicable, but dry etching suitable for micropatternization is desirable for working of a semiconductor substrate or a mask substrate of high integration degree. In this regard, a crosslinked resist film of particularly excellent etching resistance can be produced by incorporation of benzene rings into the molecular structure of the acetalized polyvinyl alcohol to be used in the present invention. For example, when the patternized film of the thus prepared resist of the present invention is formed on a chromium mask substrate and subjected to dry etching at the exposed chromium portion with a chlorine-containing gas such as carbon tetrachloride, the film reduction speed of the resist film is equal to the value of the photoresist of a novolac type phenol resin which has very excellent dry etching resistance.

The etching conditions are basically known for respective semiconductor or mask substrates to be processed. Examples of etchants to be used in combination with the resist of the invention include dry etchants such as carbon tetrachloride (suitable for Cr masks and Al films), carbon tetrafluoride (for Ta masks, $SiO_2$ films, $Si_3N_4$ films and poly-Si films), these gases being used together with a minor amount of oxygen, as desired, and wet etchants such as $(NH_4)_2Ce(NO_3)_6$ dissolved in dilute perchloric acid (for Cr masks) and $AgNO_3+NH_4F$ dissolved in dilute nitric acid (for Si+-$SiO_2$ compound films).

After etching, the resist pattern is removed by peeling off or burning with an oxygen plasma. Thus, one cycle of the lithographic steps is completed.

As described above, according to the present invention, there is provided a negative-type resist sensitive to ionizing radiation which is highly practical and suitable for production of a highly integrated semiconductor circuit or photomask for which dry etching is essentially required for micropatternization, because it has high sensitivity as well as high resolving power and also has excellent dry etching resistance.

In order to indicate fully the nature and utility of this invention, the following examples are set forth, it being understood that these examples are presented as illustrative only and are not intended to limit the scope of the invention.

EXAMPLE 1

A polyvinyl alcohol (1.0 g) having a polymerization degree of 2,000 and a saponification degree of 98%, 8 g (0.057 mole) of p-chlorobenzaldehyde and 20 cc of chloroform were charged into a 50 cc Erlenmeyer flask, and, after two drops of hydrochloric acid were added to the mixture, the reaction was carried out under stirring at 40° C. for 50 hours.

Then, the reaction mixture was added into methanol containing a neutralizing amount of NaOH, and the precipitated polymer was purified by repeating reprecipitation with chloroform and methanol to obtain an acetalized polyvinyl alcohol represented by the following formula in a yield of 95%.

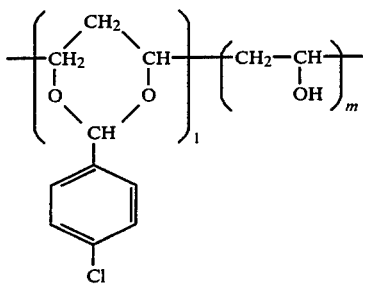

The above polymer had a solution viscosity $\eta_{sp}/c$ (where $\eta_{sp}$ is specific viscosity and c is a concentration [g/cc]) of 193 cm³/g in 0.1 g/10 cc dichloroethane solution at 30° C., the molecular weight being estimated to be about 160,000–170,000. The acetalization percentage $1/(1+m)$ as calculated from the result of elementary analysis was about 73 mole %.

The above polymer was dissolved in ethyl cellosolve acetate and filtered through a 0.2 μm filter to obtain a resist solution of 6% concentration.

The resist solution was applied on a chromium mask substrate by the spinner coating method and pre-baked at 90° C. for 30 minutes to obtain a uniform resist film of a thickness of 6,000 Å. Then, the resist film was irradiated with an electron beam of a beam radius of 0.25 μm and an energy of 10 KeV. After irradiation was effected by varying the dose, development was carried out by immersion in methyl ethyl ketone for 60 seconds and further rinsing by immersion in isopropyl alcohol for 30 seconds. Then, the residual film percentages were plotted versus doses to obtain a sensitivity curve, and the sensitivity was determined as the dose when the film percentage after development is 50%. The resist had a sensitivity of $6.0 \times 10^{-7}$ coulomb/cm².

Further, with the use of this resist, a resist film of a thickness of 6,000 Å was obtained on a chromium mask similarly as described above, and pattern drawing was carried out thereon by the use of an electron beam of a beam radius of 0.5 μm and an acceleration voltage of 10 kV in a dose of $6.0 \times 10^{-7}$ coulomb/cm². Further, this resist film was developed by treatment with methyl ethyl ketone for one minute, followed by rinsing with isopropyl alcohol for 30 minutes to form a resist pattern.

As the next step, the substrate having the resist pattern thus obtained was post-baked at 140° C. for 30 minutes and thereafter subjected to the scum elimination treatment with an oxygen plasma of a pressure of 1 Torr and an output of 100 W for one minute. The substrate was then subjected to etching at the exposed portion of the chromium film according to reactive sputter etching with a gas mixture of CCl₄ and O₂ under a pressure of $3 \times 10^{-1}$ Torr and an output of 300 W. The film reduction speed of the resist pattern was found to be 280 Å/min., thus indicating sufficient dry etching resistance.

After etching, the substrate was immersed in a film-peeling solution of a sulfuric acid-hydrogen peroxide mixture at 70° C. for 5 minutes, and thereafter the resist pattern film was peeled off to obtain a photomask having a chromium pattern comprising lines and spaces each of 1 μm.

EXAMPLE 2

With the use of a polyvinyl alcohol having a polymerization degree of 500 and m-bromobenzaldehyde, an acetalized polyvinyl alcohol (molecular weight: about 90,000) was synthesized according to the same method as in Example 1.

The resultant polymer was dissolved in ethyl cellosolve acetate and filtered with a 0.2 μm filter to obtain a resist solution of 8% concentration.

The resist solution was applied on a silicon wafer having grown polysilicon of 3,000 Å on a silicon oxide film by the spin coating method and pre-baked at 90° C. for 30 minutes to obtain a uniform resist film of a thickness of 5,000 Å. Then, on the resist film, pattern drawing was carried out by irradiation with an electron beam with a beam radius of 0.25 μm and an energy of 10 KeV in a dose of $5.0 \times 10^{-6}$ coulomb/cm². After drawing, development was carried out by treatment in methyl ethyl ketone for one minute, followed by rinsing with isopropyl alcohol for 30 seconds, to form a resist pattern.

As the next step, the silicon wafer having formed thereon the resist pattern was post-baked at 140° C. for 30 minutes and thereafter subjected to the scum elimination with a plasma similary as in Example 7. Then, dry etching was carried out similarly as in Example 7 with the use of a gas mixture of CF₄ with 2% of O₂ under the conditions of 2 Torr and output of 300 W.

After dry etching, the substrate was treated with an oxygen plasma under the conditions of 5 Torr, 300 W to peel off the resist, whereby a pattern of polysilicon having alternately repeated lines of 0.5 μm width and gaps of 0.5 μm width was obtained.

EXAMPLE 3

After an acetalized polyvinyl alcohol was synthesized similarly as in Example 1 with the use of 4-chloro-1-naphtoaldehyde and a polyvinyl alcohol (polymerization degree: 2,000), the resultant acetalized polyvinyl alcohol was dissolved in chlorobenzene to provide a 6% resist solution. The resist solution was applied on a chromium substrate by the spin coating method at a rotational speed of 2,500 r.p.m. and pre-baked at 120° C. for 30 minutes to obtain a uniform coated film of a thickness of 6,000 Å. Then, various patterns were drawn on this coated film with the use of an electron beam of 10 KeV energy in various doses. After drawing, development was carried out by immersion in chloroform for 60 seconds, followed by rinsing with isopropyl alcohol by immersion for 30 seconds, to obtain resist patterns. In this Example, the dose for providing a residual film thickness of 50% was found to be $4.5 \times 10^{-6}$ coulomb/cm².

Next, with the use of the above resist solution, a uniform coated film of a thickness of 4,000 Å was formed on a chromium substrate and then pre-baked at 120° C. for 30 minutes. Subsequently, pattern drawing was carried out on the coated film with an electron beam of an energy of 10 KeV and a beam radius of 0.5 μm. The irradiated product was subjected to development and rinsing as described above and thereafter post-baked at 140° C. for 30 minutes. The chromium substrate having thus formed thereon a resist pattern was subjected to dry etching with a gas mixture of CCl₄:O₂=3:1 under the conditions of 0.3 Torr, 300 W, for 8 minutes to obtain a Cr pattern of 1 μm width.

The resist of this Example exhibited high plasma resistance, with a film reduction speed of 150 Å/min during the dry etching.

EXAMPLE 4

According to the same procedure as in Example 1, an acetalized PVA was synthesized from p-chloromethylbenzaldehyde and a PVA (polymerization degree: 2,000). The polymer was dissolved in chlorobenzene to prepare a 6% resist solution, which was filtered with a 0.2 μm filter. The thus prepared solution was applied by spin coating at 2,500 r.p.m. on a chromium substrate and pre-baked at 120° C. for 30 minutes to obtain a uniform coated film of a thickness of 6,000 Å. Then, the resist layer was iradiated with an electron beam of an acceleration voltage of 10 kV and a diameter of 0.5 μm so as to obtain a charge density of $8 \times 10^{-7}$ C/cm$^2$. The irradiated product was thereafter developed by immersing in a developer of methyl ethyl ketone: ethanol=9:1 at a liquid temperature of 20° C. for 60 minutes. This step was followed by rinsing with isopropyl alcohol for 30 minutes, to obtain a desired pattern. After post-baking at 140° C. for 30 minutes, dry etching was carried out by means of a parallel flat plate type plasma device with a gas mixture of CCl$_4$:O$_2$=3:1 under the conditions of 0.3 Torr and 300 W for 8 minutes. Then, plasma ashing was carried out with O$_2$ gas under the conditions of 1 Torr and 400 W for 20 minutes. As the result, there was obtained a chromium mask having lines and spaces of 1 μm with good pattern edges.

OTHER EXAMPLES

Acetalization was conducted in the same manner as in Example 1, except for varying the polymerization degree of the polyvinyl alcohol (PVA) as starting materials at 500, 1,500 and 2,000 and using as the acetalizing agent in place of p-chlorobenzaldehyde substantially the same moles of cyclohexanone, acetaldehyde, benzaldehyde, m-chlorobenzaldehyde, m-nitrobenzaldehyde, p-methylbenzaldehyde, m-methylbenzaldehyde, o-chlorobenzaldehyde, 2,4-dichlorobenzaldehyde, 2,6-dichlorobenzaldehyde, m-fluorobenzaldehyde, m-bromobenzaldehyde, p-fluorobenzaldehyde, p-bromobenzaldehyde, p-iodobenzaldehyde, benzylaldehyde, 2-methyl-4-chlorobenzaldehyde, and 4-chloronaphthoaldehyde. Acetalized polyvinyl alcohols were also prepared by carrying out the post-treatment.

The thus prepared acetalized polyvinyl alcohols may be represented by the formula:

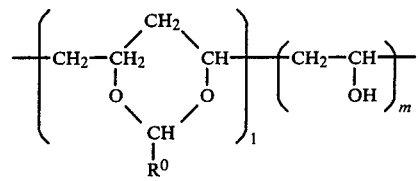

wherein the group $R^0$ corresponds to the groups as shown in Table 1 shown below.

The viscosities $\eta_{sp}/c$ and sensitivities of the sample polymers were determined similarly as in Example 1, and the resolution index ($\gamma$) was determined in each case from the gradient of the tangential line at the point of the residual film percentage 50% on the sensitivity curve [standardized residual percentage - log (irradiation energy)]. Thus, $\gamma$ is given by the following equation:

$$\gamma = \left[ \log \frac{Do}{Di} \right]^{-1}$$

wherein Di and Do are irradiation energy values obtained by extrapolation of the tangential line on the sensitivity curve at the point of residual film percentage of 50% to residual film percentages of 0 and 100%, respectively.

The results obtained are listed in Table 1 shown below. In Table 1, the reaction time for synthesis was 40 hours and the coated film thickness was 0.6 μm in all cases.

TABLE 1

| Group $R^0$ | Sample No. | PVA polymerization degree | Viscosity $\eta_{sp}/c$ | Sensitivity C/cm$^2$ | $\gamma$ value | Remarks |
|---|---|---|---|---|---|---|
| H (phenyl) | A-1 | 500 | 89 | $10.5 \times 10^{-6}$ | 1.5 | Comparative Example |
| | A-2 | 1500 | 212 | $6.0 \times 10^{-6}$ | 1.1 | Comparative Example |
| CH$_3$ (phenyl) | B-1 | 500 | 82 | $23.0 \times 10^{-6}$ | 1.3 | Comparative Example |
| | B-2 | 1500 | 236 | $8.2 \times 10^{-6}$ | 1.3 | Comparative Example |
| | B-3 | 2000 | 340 | $6.0 \times 10^{-6}$ | 1.1 | Comparative Example |
| Cl (phenyl, ortho) | C-2 | 500 | 80 | $10.0 \times 10^{-6}$ | 1.2 | Comparative Example |
| | C-3 | 1500 | 236 | $2.1 \times 10^{-6}$ | 1.1 | Comparative Example |
| Cl (phenyl, para) | D-1 | 500 | 66 | $4.0 \times 10^{-6}$ | 1.2 | Example |
| | D-2 | 1500 | 186 | $1.1 \times 10^{-6}$ | 1.2 | Example |
| | D-3 | 2000 | 193 | $0.72 \times 10^{-6}$ | 1.2 | Example |

TABLE 1-continued

| Group R⁰ | Sample No. | PVA polymerization degree | Viscosity $\eta_{sp}/c$ | Sensitivity C/cm² | $\gamma$ value | Remarks |
|---|---|---|---|---|---|---|
| 3-chlorophenyl | E-1 | 500 | 63 | $4.5 \times 10^{-6}$ | 1.2 | Example |
| | E-2 | 1500 | 169 | $1.1 \times 10^{-6}$ | 1.1 | Example |
| | E-4 | 2000 | 211 | $0.78 \times 10^{-6}$ | 1.1 | Example |
| 3-nitrophenyl | F-1 | 500 | 50 | $9.8 \times 10^{-6}$ | 1.5 | Comparative Example |
| | F-2 | 1500 | 134 | $2.0 \times 10^{-6}$ | 1.4 | Comparative Example |
| 4-methylphenyl | G-1 | 500 | 79 | $9.8 \times 10^{-6}$ | 1.7 | Comparative Example |
| | G-2 | 1500 | 225 | $4.0 \times 10^{-6}$ | 1.0 | Comparative Example |
| | G-3 | 2000 | 270 | $2.9 \times 10^{-6}$ | 1.0 | Comparative Example |
| 3-methylphenyl | H-1 | 500 | 68 | $14.0 \times 10^{-6}$ | 1.0 | Comparative Example |
| | H-2 | 1500 | 205 | $4.8 \times 10^{-6}$ | 1.0 | Comparative Example |
| | H-3 | 2000 | 250 | $3.1 \times 10^{-6}$ | 1.1 | Comparative Example |
| 2-chlorophenyl | I-1 | 500 | 55 | $5.2 \times 10^{-6}$ | 1.3 | Example |
| | I-2 | 1500 | 160 | $1.6 \times 10^{-6}$ | 1.3 | Example |
| | I-3 | 2000 | 167 | $1.1 \times 10^{-6}$ | 1.0 | Example |
| 2,4-dichlorophenyl | J-1 | 500 | 47 | $5.8 \times 10^{-6}$ | 1.2 | Example |
| | J-2 | 1500 | 126 | $1.8 \times 10^{-6}$ | 1.3 | Example |
| 2,6-dichlorophenyl | K-1 | 500 | 37 | $7.8 \times 10^{-6}$ | 1.2 | Example |
| | K-2 | 1500 | 72 | $2.4 \times 10^{-6}$ | 0.9 | Example |
| 3-fluorophenyl | L-1 | 500 | 61 | $7.0 \times 10^{-6}$ | 0.9 | Example |
| | L-2 | 1500 | 189 | $2.3 \times 10^{-6}$ | 1.4 | Example |
| | L-3 | 2000 | 240 | $1.7 \times 10^{-6}$ | 1.2 | Example |
| 3-bromophenyl | M-1 | 500 | 50 | $5.0 \times 10^{-6}$ | 1.2 | Example |
| | M-2 | 1500 | 142 | $1.3 \times 10^{-6}$ | 1.3 | Example |
| 4-fluorophenyl | L-1 | 500 | 68 | $4.7 \times 10^{-6}$ | 1.2 | Example |
| | L-2 | 1500 | 201 | $1.5 \times 10^{-6}$ | 1.3 | Example |
| | L-3 | 2000 | 251 | $1.4 \times 10^{-6}$ | 1.2 | Example |

TABLE 1-continued

| Group R⁰ | Sample No. | PVA polymerization degree | Viscosity $\eta_{sp}/c$ | Sensitivity C/cm² | γ value | Remarks |
|---|---|---|---|---|---|---|
| (phenyl-Br) | O-1 | 1500 | 111 | $1.4 \times 10^{-6}$ | 1.1 | Example |
| –(CH₂)₂–CH₃ | P-1 | 500 | 52 | $15.0 \times 10^{-6}$ | 1.4 | Comparative Example |
|  | P-2 | 1500 | 185 | $5.7 \times 10^{-6}$ | 1.2 | Comparative Example |
|  | P-3 | 2000 | 211 | $3.3 \times 10^{-6}$ | 1.1 | Comparative Example |
| –CH₂–phenyl | Q-1 | 500 | 67 | $18.0 \times 10^{-6}$ | 1.4 | Comparative Example |
|  | Q-2 | 1500 | 169 | $6.4 \times 10^{-6}$ | 1.3 | Comparative Example |
| (phenyl-CH₃, Cl) | R-1 | 500 | 75 | $7.2 \times 10^{-6}$ | 1.4 | Example |
|  | R-2 | 1500 | 215 | $3 \times 10^{-6}$ | 1.2 | Example |
|  | R-3 | 2000 | 275 | $1.1 \times 10^{-6}$ | 1.1 | Example |
| (naphthyl-Cl) | S-1 | 500 | 60 | $1.1 \times 10^{-6}$ | 1.0 | Example |
|  | S-2 | 1500 | 154 | $5.5 \times 10^{-6}$ | 1.0 | Example |

The results shown in the above Table 1 indicate that the acetalized polyvinyl alcohols constituting Examples of the present invention have substantially higher sensitivities than others.

Further, dry etching resistance was measured for some of the acetalized polyvinyl alcohols obtained as described above and the commercially available resists. The results are shown in the following Table 2.

TABLE 2

| Sample No. | Etching Speed (Å/minute) | Remarks |
|---|---|---|
| A - 2 | 340 | Comparative Example |
| B - 2 | 250 | " |
| C - 3 | 250 | " |
| D - 3 | 280 | Example |
| E - 4 | 280 | " |
| J - 2 | 300 | " |
| Commercial resist *1 | 540 | Comparative Example |
| Commercial resist *2 | 390 | " |
| Commercial resist *3 | 250 | " |

*1 Glycidyl methacrylate type negative-type electron beam resist (OEBR-100, produced by Tokyo Oka Kogyo Co.)
*2 Polymaleic acid monomethyl methacrylate type negative-type electron beam resist (SEL-N, produced by Somar Kogyo Co.)
*3 Novolac type phenol resin type photoresist having quinone diazide (AZ-1350, produced by Sipley Co.)

The results shown in the above Table 2 indicate that the acetalized polyvinyl alcohol of the present invention is an electron beam resist having ample dry etching resistance.

We claim:

1. A negative-type resist cross-linked by exposure to ionizing radiation, which comprises a cross-linked acetalized polyvinyl alcohol polymer having a molecular weight of 10,000 to 1,000,000 represented by the formula:

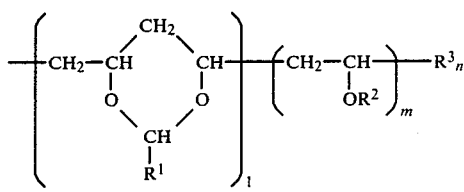

wherein: R¹ represents an aromatic ring having halogen substitution; R² represents a hydrogen atom, which may partially be substituted by an acetyl group; R³ being absent or if present, being a monomeric unit copolymerizable with vinyl acetate; and l, m, n are integers indicating polymerization degrees.

2. A negative-type resist according to claim 1, which comprises a mixture of said polyvinyl alcohol polymer with another polymer compatible therewith.

3. A negative-type resist according to claim 2, wherein said another polymer is selected from polyvinyl acetate, ethylene/vinyl acetate copolymer, styrene/vinyl acetate copolymer and partially saponified products thereof.

4. A negative type resist according to claim 1, wherein the acetalized moiety content as represented by $1/(l+m+n)$ in said acetalized polyvinyl alcohol is 20 to 85 mole %.

* * * * *